(12) United States Patent
Luo et al.

(10) Patent No.: US 7,791,112 B2
(45) Date of Patent: Sep. 7, 2010

(54) CHANNEL STRESS ENGINEERING USING LOCALIZED ION IMPLANTATION INDUCED GATE ELECTRODE VOLUMETRIC CHANGE

(75) Inventors: Zhjiong Luo, Carmel, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 11/867,264

(22) Filed: Oct. 4, 2007

(65) Prior Publication Data

US 2009/0090938 A1  Apr. 9, 2009

(51) Int. Cl.
*H01L 21/8238* (2006.01)
(52) U.S. Cl. ............... 257/213; 257/288; 257/411; 257/E21.249
(58) Field of Classification Search .......... 257/213, 257/288, 411, E21.249
See application file for complete search history.

(56) References Cited

U.S. PATENT DOCUMENTS 6,621,131 B2   9/2003  Murthy et al.
6,800,887 B1   10/2004 Weber et al.
2004/0217431 A1* 11/2004 Shimada ............... 257/411
2005/0095825 A1*  5/2005 Saito et al. ............ 438/527
2007/0018202 A1  1/2007  Zhu

OTHER PUBLICATIONS

Y. Kasukabe et al., "Epitaxial growth of (001)-oriented titanium nitride thin films by N implantation", J. Vac. Sci. Technol. A, 16(2), Mar./Apr. 1998, pp. 482-489.

* cited by examiner

*Primary Examiner*—Tan N Tran
(74) *Attorney, Agent, or Firm*—Scully, Scott, Murphy & Presser, P.C.; Joseph P. Abate, Esq.

(57) ABSTRACT

A method for fabricating a semiconductor structure uses a volumetric change ion implanted into a volumetric change portion of a gate electrode that is located over a channel region within a semiconductor substrate to form a volume changed portion of the gate electrode located over the channel region within the semiconductor substrate. The volume changed portion of the gate electrode is typically bidirectionally symmetrically graded in a vertical direction. The volume-changed portion of the gate electrode has a first stress that induces a second stress different than the first stress into the channel region of the semiconductor substrate.

12 Claims, 6 Drawing Sheets

CHANNEL STRESS ENGINEERING USING LOCALIZED ION IMPLANTATION INDUCED GATE ELECTRODE VOLUMETRIC CHANGE

BACKGROUND

1. Field of the Invention

The invention relates generally to channel stress within field effect devices. More particularly, the invention relates to efficient methods for inducing channel stress within field effect devices.

2. Description of the Related Art

Field effect devices, such as but not limited to field effect transistor devices, are common semiconductor devices that are used within semiconductor circuits. In particular, field effect transistor devices have been effectively scaled in dimension over the period of several decades to provide semiconductor circuits with increasing levels of integration and increasing levels of functionality.

Recent advances in performance of field effect devices have focused upon both a selection of a particular crystallographic orientation of a semiconductor substrate upon which is fabricated a field effect device, as well as introduction of a particular channel stress within the particular crystallographic orientation of the semiconductor substrate within which is fabricated the field effect device. In that regard, for example, electron mobility within an nFET device is typically enhanced by a compressive stress within a vertical direction within a 100 crystallographic orientation silicon or silicon-germanium alloy semiconductor substrate upon which is fabricated the nFET device. In comparison, and also for example, a hole mobility within a pFET device is typically enhanced by a tensile stress within a vertical direction within a 110 silicon or silicon-germanium alloy semiconductor substrate upon which is fabricated the pFET device.

While mechanical stress effects are thus desirable to provide enhanced performance within field effect devices within semiconductor substrates, mechanical stress effects within field effect devices within semiconductor substrates are nonetheless not entirely without problems. In that regard, mechanical stress effects are often difficult to reliably and uniformly reproduce as field effect device dimensions, including channel length dimensions and device pitch dimensions, decrease.

Various crystallographic effects and related mechanical stress effects with respect to semiconductor devices and semiconductor structures are known in the semiconductor fabrication art.

For example, Kasukabe, et al., in "Epitaxial growth of (001)-oriented titanium nitride thin films by N implantation," J. Vac. Sci. Technology A, 16(2), March/April 1998, teaches that lattice strain effects influence crystallographic orientation transitions when fabricating a titanium nitride layer incident to nitrogen ion implantation of a titanium layer located upon a monocrystalline substrate.

Semiconductor substrate crystallographic effects, and related mechanical stress effects, are likely to be of continued prominence as semiconductor technology advances. To that end, desirable are semiconductor structures and methods for fabrication thereof that provide for efficient introduction of desirable channel stress within particular crystallographically oriented semiconductor substrate channels within semiconductor devices.

SUMMARY

The invention provides a semiconductor structure and method for fabricating the semiconductor structure. The method for fabricating the semiconductor structure includes use of an ion implantation method for implanting a volumetric change ion into a portion of a gate electrode that is located over a channel region within a semiconductor substrate to provide a volumetrically changed ion implanted material portion of the gate electrode that has a first stress that induces a second stress different than the first stress within the channel region within the semiconductor substrate. Particular variations of an embodiment of the invention use particular volumetric change ion implanting species to form the volumetrically changed ion implanted material portion of the gate electrode that provides the volume change (i.e., a volume expansion or a volume contraction) with respect to a remainder portion of the gate electrode. Such a volume change within a portion of the gate electrode affects the first stress within the ion implanted material portion of the gate electrode, and the second stress that is different than the first stress within the channel region within the semiconductor substrate. Since ion implantation methods typically provide a Gaussian or similar distribution with respect to an ion implanted material range, the volumetrically changed ion implanted material portion of the gate electrode will typically have a uniformly graded (i.e., vertically increasing subsequently vertically decreasing) concentration of a volume change inducing ion implanted material.

A semiconductor structure in accordance with the invention includes a gate electrode located over a channel region that separates a pair of source/drain regions within a semiconductor substrate. The gate electrode includes a vertically graded material composition portion having a first stress, and the channel region has a second stress different than the first stress.

Another semiconductor structure in accordance with the invention includes a gate electrode located over channel region that separates a pair of source/drain regions within a semiconductor substrate. The gate electrode includes a vertically graded metal nitride material composition portion interposed between a pair of non-graded metal nitride material composition portions. The vertically graded metal nitride material composition portion has a first stress, and the channel region has a second stress different than the first stress.

A particular method for fabricating a semiconductor structure in accordance with the invention includes ion implanting within a volumetric change portion of a gate electrode located over a channel region within a semiconductor substrate that separates a pair of source/drain regions within the semiconductor substrate a volumetric change ion that provides a changed volume portion of the gate electrode from the volumetric change portion of the gate electrode. The changed volume portion of the gate electrode has a first stress that in turn induces a second stress different than the first stress within the channel region.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENT

The invention, which includes: (1) a semiconductor structure that includes a gate electrode a portion of which has a first stress that induces a second stress different than the first stress within a channel region of a semiconductor substrate over which is located the gate electrode; and (2) a method for fabricating the semiconductor structure that includes the above described gate electrode, is understood within the context of the description set forth below. The description set forth below is understood within the context of the drawings described above. Since the drawings are intended for illustrative purposes, the drawings are not necessarily drawn to scale.

FIG. 1 to FIG. 9 show a series of schematic cross-sectional diagrams illustrating the results of progressive stages in fabricating a semiconductor structure in accordance with a particular embodiment of the invention. This particular embodiment of the invention comprises a sole embodiment of the invention.

Figure 1:
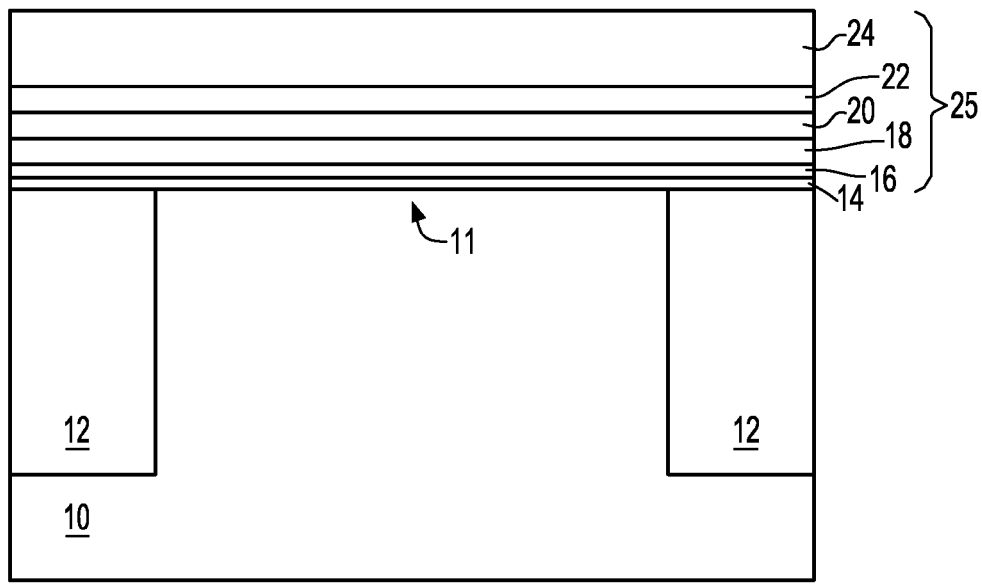
FIG. 1 to FIG. 9 show a series of schematic cross-sectional diagrams illustrating the results of progressive stages in fabricating a semiconductor structure in accordance with a particular embodiment of the invention.

FIG. 1 shows a schematic cross-sectional diagram of the semiconductor structure at an early stage in the fabrication thereof in accordance with this particular sole embodiment.

FIG. 1 shows a semiconductor substrate 10 having an active region 11 that separates a plurality of isolation regions 12 embedded within the semiconductor substrate 10. A gate dielectric 14 is located upon the active region 11 of the semiconductor substrate 10, as well as the plurality of isolation regions 12. A lower gate material layer 16 is located upon the gate dielectric 14. A lower buffer layer 18 is located upon the lower gate material layer 16. A volumetric change layer 20 is located upon the lower buffer layer 18. An upper buffer layer 22 is located upon the volumetric change layer 20. An upper gate material layer 24 is located upon the upper buffer layer 22. Each of the foregoing semiconductor substrate 10, isolation regions 12 and overlying layers 14/16/18/20/22/24 that in an aggregate comprise a gate stack 25 may comprise materials, have dimensions and be formed using methods that are otherwise generally conventional in the semiconductor fabrication art.

The semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the semiconductor substrate 10 has a thickness from about 1 to about 3 mm.

The isolation regions 12 may comprise any of several dielectric isolation materials. Non-limiting examples of candidate dielectric isolation materials include oxides, nitrides and oxynitrides, particularly of silicon, but oxides, nitrides and oxynitrides of other elements are not excluded. Also not excluded are dielectric isolation materials that need not necessarily in general include oxides, nitrides and/or oxynitrides. The isolation regions 12 may comprise a crystalline or a non-crystalline dielectric material, with crystalline dielectric materials often highly preferred. The isolation regions 12 may be formed using any of several methods. Non-limiting examples include ion implantation methods, thermal or plasma oxidation or nitridation methods, chemical vapor deposition methods and physical vapor deposition methods. Typically, the isolation regions 12 comprise at least in part an oxide of the semiconductor material from which is comprised the semiconductor substrate 10.

Although the instant embodiment generally illustrates the invention apparently within the context of a bulk semiconductor substrate that comprises the semiconductor substrate 10, neither the embodiment, nor the invention, is intended to be so limited. Rather, the embodiment and the invention may alternatively be practiced while using in place of a bulk semiconductor substrate as the semiconductor substrate 10 a semiconductor-on-insulator substrate. Such a semiconductor-on-insulator substrate would result from incorporation of a buried dielectric layer interposed between a base semiconductor substrate portion and a surface semiconductor layer portion of a bulk semiconductor substrate.

The embodiment and the invention also contemplate the use of a hybrid orientation substrate for the semiconductor substrate 10. A hybrid orientation substrate includes multiple crystallographic orientation semiconductor regions supported over a single substrate, such as a single semiconductor substrate.

Semiconductor-on-insulator substrates and hybrid orientation substrates may be fabricated using methods that are generally conventional in the semiconductor fabrication art. Non-limiting examples include layer transfer methods, layer lamination methods and separation by implantation of oxygen (SIMOX) methods.

The gate dielectric 14 may comprise conventional dielectric materials such as but not limited to oxides, nitrides and oxynitrides of silicon that have a dielectric constant from about 4 to about 20, measured in vacuum. Alternatively, the gate dielectric 14 may comprise generally higher dielectric constant dielectric materials having a dielectric constant from about 20 to at least about 100. Such higher dielectric constant dielectric materials may include, but are not limited to hafnium oxides, hafnium silicates, titanium oxides, barium-strontium-titantates (BSTs) and lead-zirconate-titanates (PZTs). The gate dielectric 14 may be formed using any of several methods that are appropriate to the material(s) of composition of the gate dielectric 14. Included, but not limiting, are thermal or plasma oxidation or nitridation methods, chemical vapor deposition methods and physical vapor deposition methods. Typically, the gate dielectric 14 comprises a thermal silicon oxide dielectric material, or an alternative appropriately deposited dielectric material, that has a thickness from about 10 to about 70 angstroms.

The lower gate material layer 16 and the upper gate material layer 24 may comprise the same or different gate materials within the context of gate material composition, crystallographic properties, dopant polarity and dopant concentration. Typically the lower gate material layer 16 and the upper gate material layer 24 comprise the same gate material with respect to each of the foregoing characteristics. The lower gate material layer 16 and the upper gate material layer 24 have a "reactivity" of that is intended within the context of further processing of the semiconductor structure whose schematic cross-sectional diagram is illustrated in FIG. 1. As will be illustrated within the context of further disclosure below, such reactivity is intended within the context of a particular implanted ion, such as a particular nitrogen implanted ion. Candidate gate materials for the lower gate material layer 16 and the upper gate material layer 24 include silicon, germanium and silicon-germanium alloy gate materials, where any of the foregoing gate materials are intended as polycrystalline gate materials, although monocrystalline gate materials and amorphous gate materials are not necessarily excluded within the context of the instant embodiment. Such gate materials may be fabricated using methods that are otherwise generally conventional in the semiconductor fabrication art. Non-limiting examples include chemical vapor deposition methods and physical vapor deposition methods. Typically each of the lower gate material layer 16 and the upper gate material layer 24 comprises at least in part a polycrystalline silicon gate material. Typically, the lower gate material layer 16 has a thickness from about 10 to about 1000 angstroms, while the upper gate material layer 24 has a thickness from about 10 to about 1000 angstroms.

The lower buffer layer 18 and the upper buffer layer 22 typically comprise a buffer material. Such a buffer material within the context of the instant embodiment is intended as having an electrical conductivity stability and a volumetric stability of the buffer layer 18 or 22 incident to ion implanting, most particularly, with the nitrogen ion as described above, still further in accordance with additional disclosure and description that will be provided below. Thus, the lower buffer layer 18 and the upper buffer layer 22 may comprise any of several materials that are non-reactive as measured by electrical conductivity stability and volumetric stability incident to implantation, most particularly, with a nitrogen ion. Generally, although not exclusively, the lower buffer layer 18 and the upper buffer layer 22 will comprise a metal nitride that is not susceptible to appreciable (i.e., greater than about 20%) electrical conductivity change or volumetric change incident to ion implantation with a nitrogen ion in accordance with further disclosure and description below. Typically, each of the lower buffer layer 18 and the upper buffer layer 22 has a thickness from about 10 to about 1000 angstroms.

The volumetric change layer 20 may comprise any of several materials which incident to ion implantation with a particular ion, in accordance with further description below, is subject to a volumetric change. In general, the embodiment contemplates the possibility of a positive volumetric change or a negative volumetric change incident to such ion implantation. However, more specifically the instant embodiment contemplates a positive volumetric change of a material from which is comprised the volumetric change layer 20 when the volumetric change layer 20 is implanted with a nitrogen ion, while not compromising electrical continuity of the ion implanted volumetric change layer 20 within the gate stack 25.

From a practical perspective, the volumetric change layer 20 will generally comprise a base metal which when ion implanted with a nitrogen ion will form a metal nitride having a greater volume than the base metal, absent compromise in electrical properties of the gate stack 25. To that end, candidate metals include, but are not limited to titanium, tantalum, tungsten, platinum, cobalt and nickel metals which when ion implanted with a nitrogen ion form their corresponding metal nitrides. Also contemplated by the instant embodiment are alloys of the foregoing metals that provide their corresponding metal alloy nitrides. Typically, the foregoing metals may be formed as the volumetric change layer 20 using methods including but not limited to chemical vapor deposition methods and physical vapor deposition methods. Typically, the volumetric change layer 20 has a thickness from about 10 to about 1000 angstroms.

Figure 2:
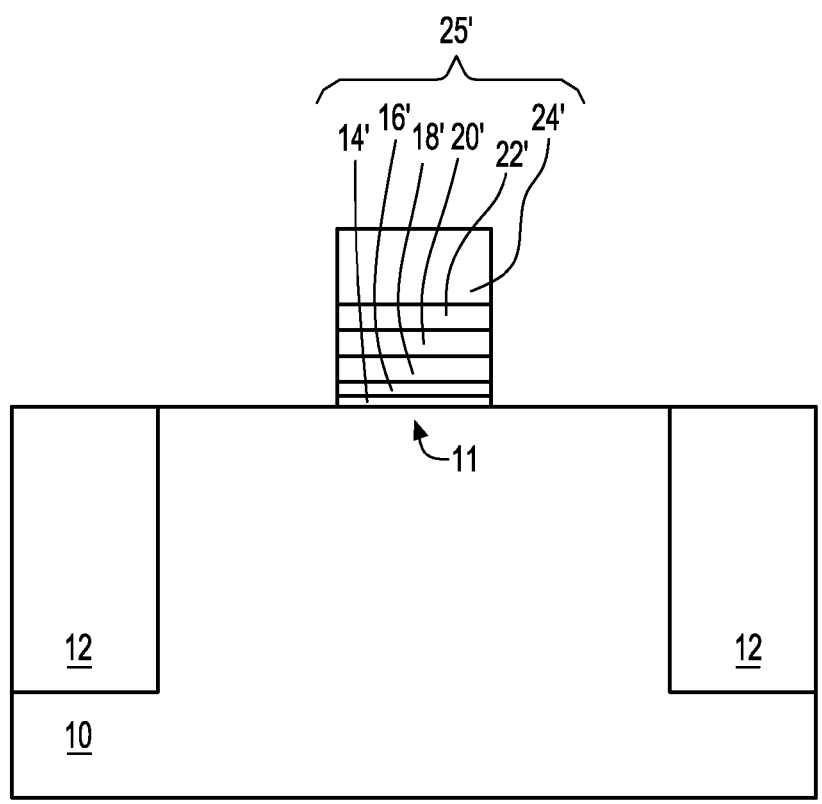

FIG. 2 shows the results of patterning the gate stack 25 that includes the above described layers 14/16/18/20/22/24 that are illustrated in FIG. 1 to form a corresponding gate stack 25' that comprises the layers 14'/16'/18'/20'/22'/24'. The layers 14'/16'/18'/20'/22'/24' include: (1) a gate dielectric 14' located upon the active region 11 of the semiconductor substrate 10; (2) a lower gate material layer 16' located upon the gate dielectric 14'; (3) a lower buffer layer 18' located upon the lower gate material layer 16'; (4) a volumetric change layer 20' located upon the lower buffer layer 18'; (5) an upper buffer layer 22' located upon the volumetric change layer 20'; and (6) an upper gate material layer 24' located upon the upper buffer layer 22'.

The foregoing patterning of the gate stack 25 that is illustrated in FIG. 1 to provide the gate stack 25' that is illustrated in FIG. 2 is typically effected using photolithographic and etch methods that are otherwise generally conventional in the semiconductor fabrication art. Such photolithographic and etch methods will typically use a mask layer comprised of a photoresist material that is otherwise generally conventional in the semiconductor fabrication art. Non-limiting examples of suitable photoresist materials include positive photoresist materials, negative photoresist materials and hybrid photoresist materials that have properties of both positive photoresist materials and negative photoresist materials. Appropriate etch methods that may be used to form the gate stack 25' that is illustrated in FIG. 2 from the gate stack 25 that is illustrated in FIG. 1 will typically comprise plasma etch methods that use an etchant gas composition, or a series of etchant gas compositions, appropriate to the materials from which are comprised the individual layers within the gate stack 25 that is illustrated in FIG. 1. Such etchant gas compositions may include, but are not necessarily limited to, chlorine containing etchant gas compositions, fluorine containing ethcant gas compositions and bromine containing etchant gas compositions. Plasma etch methods are desirable for forming the gate stack 25' that is illustrated in FIG. 2 from the gate stack 25 that is illustrated in FIG. 1 insofar as plasma etch methods provide generally straight sidewalls to the gate stack 25'.

Figure 3:
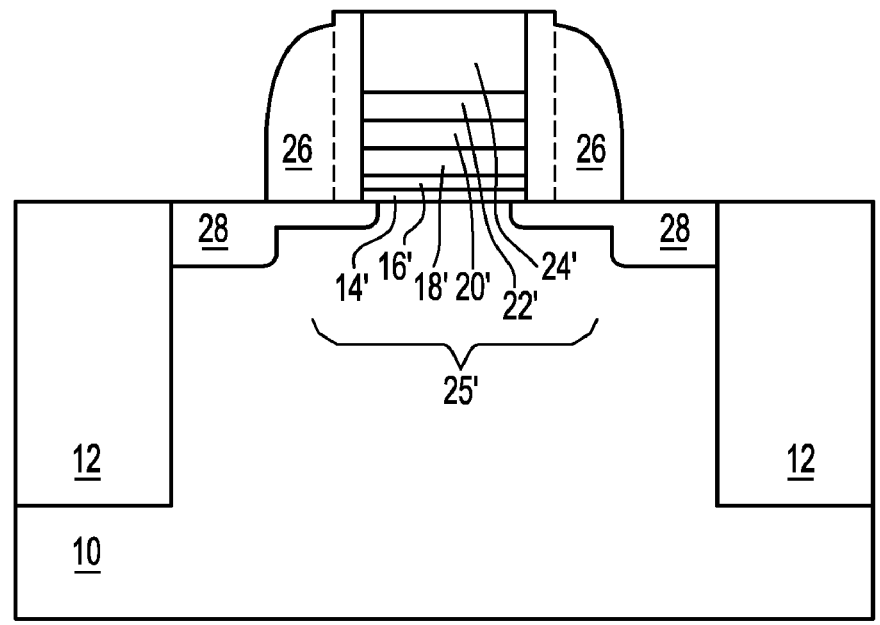

FIG. 3 shows a spacer 26 (illustrated as plural layers in cross-section but intended as a single layer encircling the gate stack 25' in plan view) located adjoining opposite sidewalls of the gate stack 25'. The spacer 26 may comprise materials including, but not limited to conductor materials and dielectric materials. Conductor spacer materials are less common, but are nonetheless known. Dielectric spacer materials are more common. In particular, dielectric spacer materials may be formed using methods analogous, equivalent or identical to the methods that are used for forming the isolation regions 12. In general, the spacer 26 is also formed with the distinctive inward pointing spacer shape by using a blanket layer deposition and anisotropic etchback method. As is illustrated within the context of the phantom lines that are illustrated within the spacer 26, the spacer 26 may also comprise multiple laminated layers. When comprising such a laminated construction, the spacer 26 typically comprises a silicon oxide dielectric material that is located upon a silicon nitride dielectric material that is in turn located upon and passivating a sidewall of the gate stack 25'.

FIG. 3 also shows a pair of source/drain regions 28 located and formed into the active region 11 of the semiconductor substrate 10 and separated by a channel region that is located beneath the gate stack 25'. The source/drain regions 28 will comprise an appropriate dopant material for a desired polarity of the field effect transistor that is illustrated in FIG. 3. As is understood by a person skilled in the art, the pair of source/drain regions 28 is formed using a two step ion implantation method. A first ion implantation process step within the two step ion implantation method uses the gate stack 25' absent the spacer 26 as a mask, to form a pair of extension regions each of which extends beneath the spacer 26. A second ion implantation process step within the two step method uses the gate stack 25' and the spacer 26 as a mask to form the larger contact region portions of the pair of source/drain regions 28, while simultaneously incorporating the pair of extension regions. Dopant levels are from about 1e19 to about 1e21 dopant atoms per cubic centimeter within each of the pair of source/drain regions 28. Extension regions within the pair of source/drain regions 28 may under certain circumstances be more lightly doped than contact regions with the pair of source/drain regions 28, although such differential doping concentrations are not a requirement of the invention.

Figure 4:
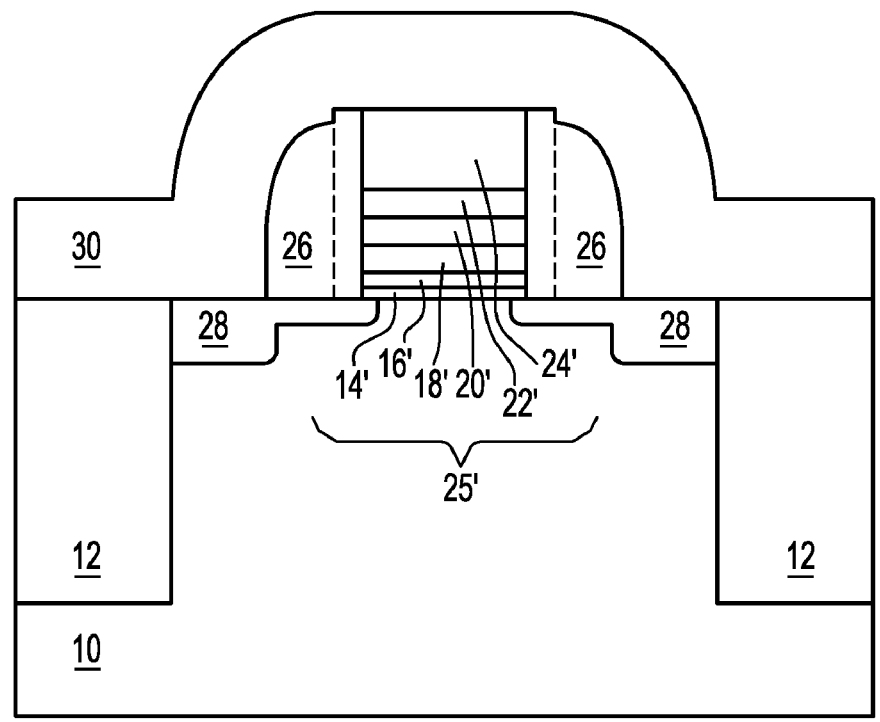

FIG. 4 shows a capping layer 30 located upon the semiconductor structure of FIG. 3. The capping layer 30 may typically comprise, but is not necessarily limited to, a dielectric capping material. Particular candidate dielectric capping materials may include, but are not necessarily limited to, silicon oxide, silicon nitride and silicon oxynitride dielectric capping materials that may be formed using methods and materials analogous, equivalent or identical to the methods and materials that are used for forming the isolation regions 12. Typically the dielectric capping layer 30 has a thickness from about 100 to about 5000 angstroms.

Figure 5:
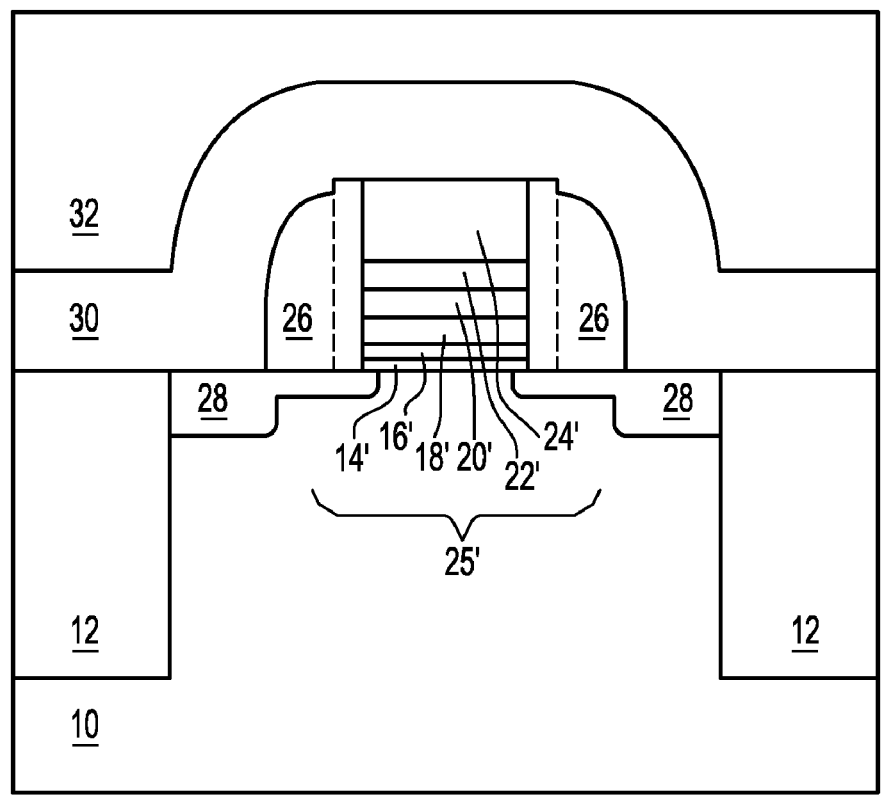

FIG. 5 shows a backfilling layer 32 located upon the semiconductor structure whose schematic cross-sectional diagram is illustrated in FIG. 4, and in particular upon the capping layer 30 within the semiconductor structure whose schematic cross-sectional diagram is illustrated in FIG. 4. The backfilling layer 32 may comprise any of several backfilling materials. Backfilling dielectric materials are particularly common but by no means limit the invention. The backfilling dielectric materials may comprise spin-on materials such as but not limited to spin-on-polymer materials and spin-on-glass materials. Again, the embodiment is not particularly limited to those materials. Typically, the backfilling layer 32 comprises a spin-on material, such as but not limited to a spin-on polymer material, that has a thickness from about 100 to about 1000 angstroms.

Figure 6:
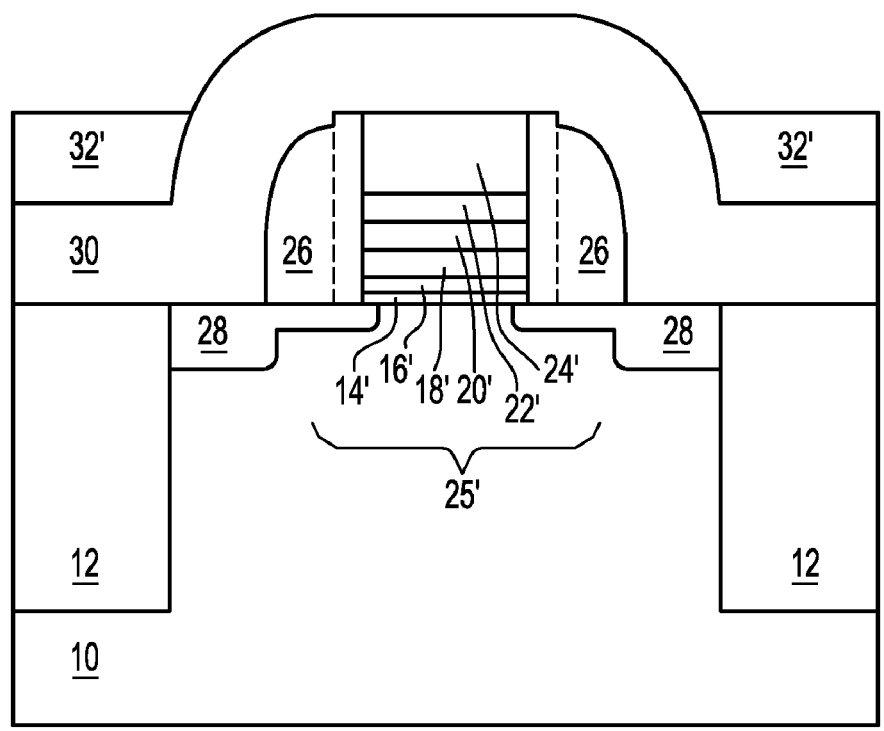

FIG. 6 shows the results of etching back the backfilling layer 32 to form a backfilling layer 32' that leaves exposed a portion of the capping layer 30 that is located over the gate stack 25'. Etching back of the backfilling layer 32 to form the backfilling layer 32' may be effected using methods and materials that are otherwise generally conventional in the semiconductor fabrication art. Such methods may include, but are not necessarily limited to, reactive ion etch methods and wet chemical etch methods. When comprised of a spin-on-polymer material, the backfilling layer 32 will typically be etched back using an oxygen containing plasma etch method.

Figure 7:
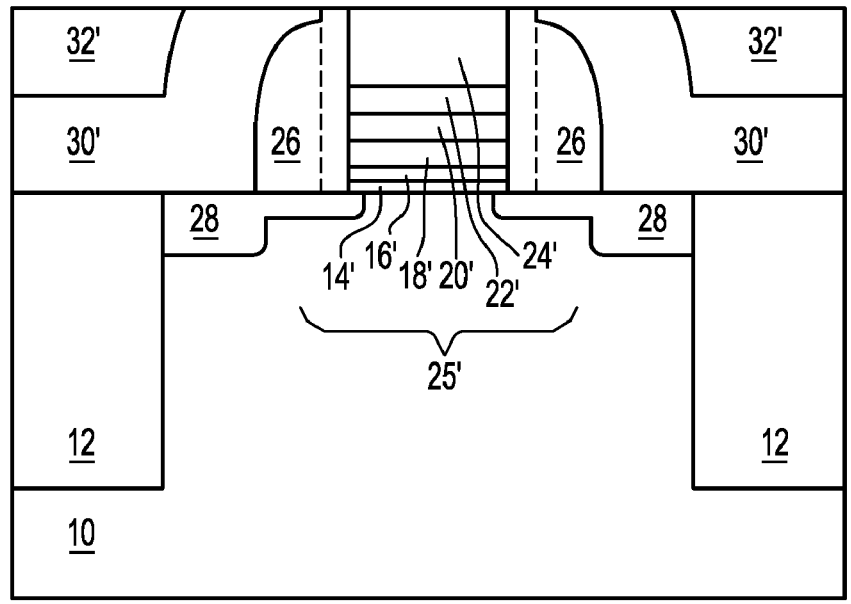

FIG. 7 shows the results of stripping a portion of the capping layer 30 from over the gate stack 25' to form a capping layer 30' located adjacent and adjoining the backfilling layer 32'. The pertinent portion of the capping layer 30 that is located over the gate stack 25' may be stripped to provide the capping layer 30' while using methods and materials that are otherwise generally conventional in the semiconductor fabrication art. Included in particular are wet chemical stripping and etch methods, and dry plasma stripping and etch methods. When the capping layer 30 comprises in substantial part a silicon nitride material, the pertinent portion of the capping layer may often be etched to provide the capping layer 30' while using an aqueous phosphoric acid solution, at elevated temperature. The embodiment is not however, so limited.

Figure 8:
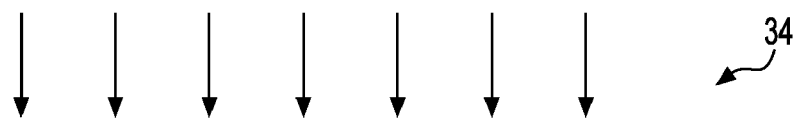
Figure 8:
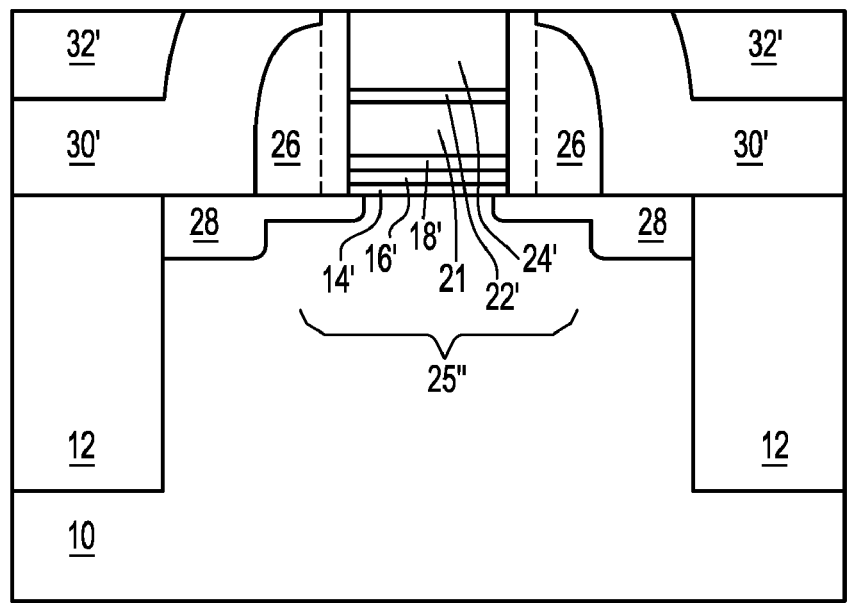

FIG. 8 shows the results of ion implanting a volume changing ion 34 into the volumetric change layer 20' to provide a changed volume layer 21. Within the context of the instant embodiment when the volumetric change layer 20' comprises a nitride forming metal, the volume changing ion 34 is typically a nitrogen ion. Such a nitrogen ion when implanted into the nitride forming metal from which is comprised the volumetric change layer 20' provides a metal nitride that typically, although not necessarily exclusively, has a larger volume than the nitride forming metal. Within the context of FIG. 8, such a volume expansion of the volume changed layer 21 with respect to the volumetric change layer 20' imparts a compressive stress in a vertical direction into the channel region of the semiconductor substrate 10 beneath a gate stack 25" that includes the changed volume layer 21. Such a compressive channel stress in the vertical direction is desirable within an nFET device that is fabricated using a (100) silicon or silicon-germanium alloy semiconductor substrate 10. Under the alternative circumstances where the volumetric change layer 20' has a larger volume than the changed volume layer 21 after ion implantation, a tensile stress may alternatively be imparted in a vertical direction within the channel region within a semiconductor substrate beneath a pertinent gate stack. Such a tensile channel stress in the vertical direction is desirable within a pFET device that is fabricated using a (110) silicon or silicon-germanium alloy semiconductor substrate 10.

The volume changing ion 34 that is illustrated in FIG. 8, when comprising nitrogen, is typically provided at a dose from about 1e12 to about 1e22 volume changing ions per square centimeter, and at an ion implantation energy from about 1 to about 100 keV.

As is further understood by a person skilled in the art, implanting ions (i.e., such as the volume changing ion 34) in general have a Gaussian distribution or related range distribution as a function of ion implant energy. For that reason, the volume changed layer 21 will have a higher volume changing ion content within the vertical center of the volume changed layer 21. A concentration of the volume changing ion in other portions of the volume changed layer 21 will decrease in a gradient fashion until reaching the lower buffer layer 18' and the upper buffer layer 22'.

Within the context of the instant embodiment, the changed volume layer 21 will have a stress from about 0.1 to about 20 GPa (either tensile or compressive) that will induce a stress into the channel region beneath the gate stack 25" from about 0.1 to about 20 GPa (compressive or tensile).

Figure 9:
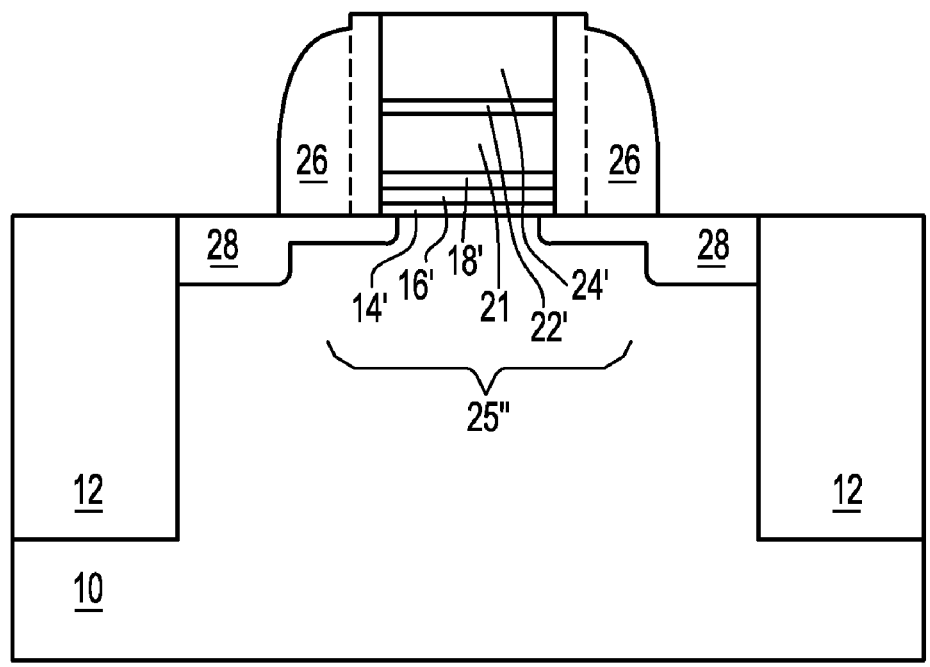

FIG. 9 shows the results of optionally stripping the backfilling layer 32' and the capping layer 30' from the semiconductor structure of FIG. 8 to provide a fully completed semiconductor structure that includes a field effect transistor. The backfilling layer 32' and the capping layer 30' may be stripped from the semiconductor structure of FIG. 8 to provide the semiconductor structure of FIG. 9 while using etch methods and materials analogous to those that were used to form the backfilling layer 32' that is illustrated in FIG. 6 from the backfilling layer 32' that is illustrated in FIG. 5 and the capping layer 30' that is illustrated in FIG. 7 from the capping layer 30 that is illustrated in FIG. 6.

Within the field effect transistor whose schematic cross-sectional diagram is illustrated in FIG. 9, a gate stack 25" includes a changed volume layer 21 that derives from a volumetric change layer 20' (illustrated in FIG. 7) that is ion implanted with an appropriate volume changing ion 34 (illustrated in FIG. 8) to provide either a positive or a negative volume change to the volumetric change layer 20' when forming the changed volume layer 21. The change in volume when ion implanting the volumetric change layer 20' to form the changed volume layer 21 when positive provides a tensile mechanical stress within the gate stack 25" that is relieved in part by imparting a compressive mechanical stress within a channel region of the semiconductor substrate 10 beneath the gate stack 25". Similarly, a negative volume change when forming the volume changed layer 21 from the volumetric change layer 20' provides a compressive stress within the gate stack 25" that is relieved in part by imparting a tensile stress within the channel region within the semiconductor substrate 10 beneath the gate stack 25".

While the foregoing embodiment illustrates the invention most particularly within the context of a volumetric increase of a volumetric change layer that comprises a nitride forming metal within a gate stack when implanting a nitrogen volume changing ion into the nitride forming metal to form a metal nitride from the nitride forming metal, the embodiment and the invention are not intended to be so limited.

Rather, for example and without further limitation, the embodiment also contemplates that a similar result may be achieved by starting with the same gate stack 25' that is illustrated in FIG. 2 and using a silicon volume changing ion or a germanium volume changing ion to form a metal silicide changed volume layer or a metal germanicide changed volume layer rather than a metal nitride changed volume layer 21 that is illustrated in FIG. 8. Under such circumstances, the lower buffer layer 18' and the upper buffer layer 22' that are illustrated in FIG. 2 may not be needed, since while a nitrogen volume changing ion is detrimental to the lower gate material layer 16' and the upper gate material layer 24' due to formation of a silicon nitride material which is an insulator, a silicon volume changing ion or a germanium volume changing ion is not detrimental.

Similarly, the embodiment also contemplates that a germanium volume changing ion or a metal volume changing ion may be used with a silicon gate absent a volumetric change layer, or a lower or an upper buffer layer, to provided a graded (i.e., bidirectionally graded) silicon-germanium or metal silicide volume changed region within the silicon gate, which will typically comprise a polysilicon gate.

Figure 10:
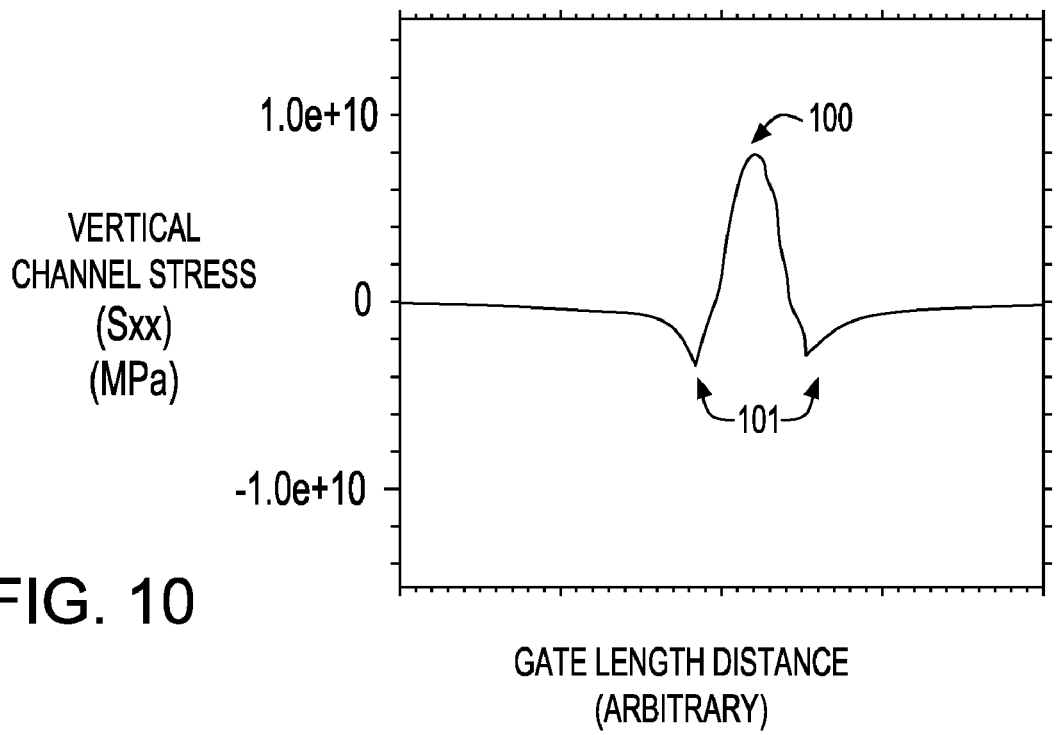
FIG. 10 and FIG. 11 show a pair of graphs of Vertical Stress Sxx versus Gate Length Dimension for a gate electrode fabricated generally in accordance with the invention.
Figure 11:
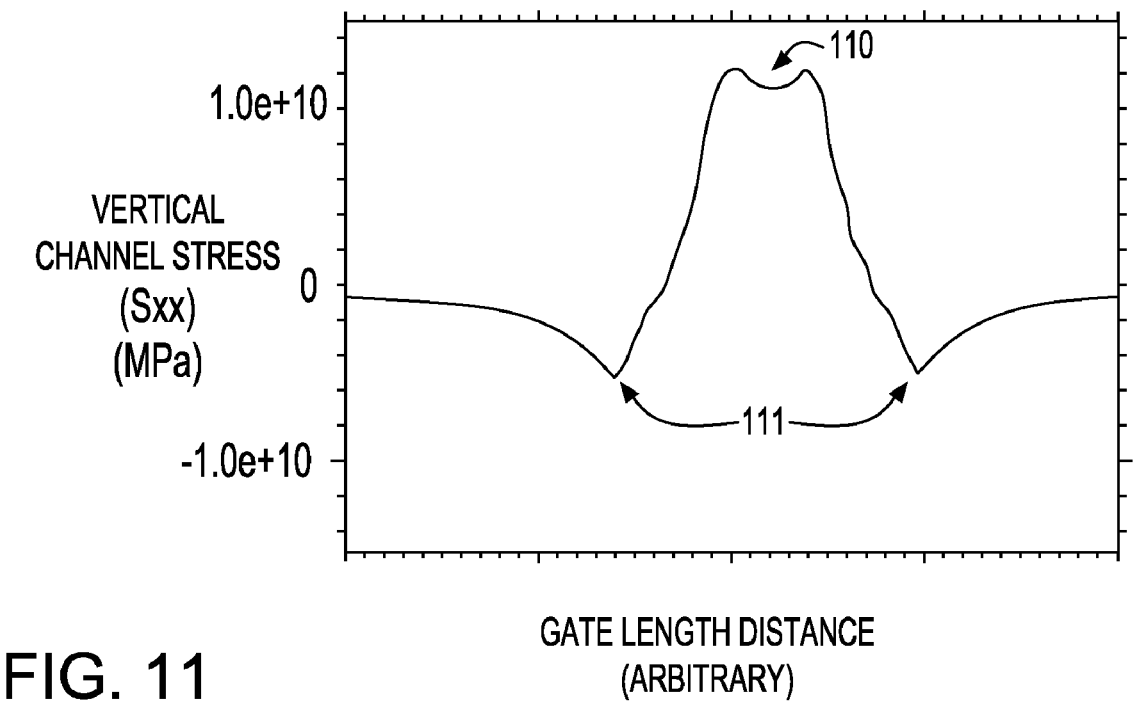

By way of examples of the invention, FIG. 10 and FIG. 11 show a pair of graphs of Vertical Channel Stress Sxx versus Gate Length Distance that is derived from a computer simulation in accordance the foregoing embodiment. The basic structure used in the simulation included a (100) silicon semiconductor substrate having a 1.2 nm thick silicon oxide gate dielectric located thereupon, and a polysilicon gate located further upon the gate dielectric. The polysilicon gate included a first layer of polysilicon of thickness 10 nanometers located upon the gate dielectric. A vertically bidirectionally graded silicon-germanium (nominal 50:50 atomic percent) alloy layer of thickness about 20 nanometers was located upon the first layer of polysilicon. Finally an upper layer of polysilicon of thickness about 120 nanometers was located upon the graded silicon-germanium alloy layer. The computer simulation also assumed a gate length of 60 nanometers.

FIG. 10 shows a graph of Vertical Channel Stress Sxx vs Gate Length Distance that further assumes a comparatively large grain size for the lower polysilicon layer within the polysilicon gate electrode. FIG. 11 shows a graph of Vertical Channel Stress Sxx vs Gate Length Distance that further assumes a comparatively small grain size within the lower polysilicon layer within the polysilicon gate electrode. Within FIG. 10, inflection points 101 correspond with gate electrode edges. Within FIG. 11, inflection points 111 correspond with gate electrode edges. As is illustrated in FIG. 10 in comparison with FIG. 11, a comparatively larger grain size within a lower polysilicon layer within a polysilicon gate electrode provides a generally lower vertical channel stress peak 100 at about 800 GPa compressive stress in comparison with the vertical channel stress peak 110 at about 1.1 GPa compressive stress in FIG. 11.

The preferred embodiment is illustrative of the invention rather than limiting of the invention. Revisions and modifications may be made to methods, materials structures and dimensions of a semiconductor structure in accordance with the preferred embodiment while still providing a semiconductor structure in accordance with the invention, further in accordance with the accompanying claims.

What is claimed is:

1. A semiconductor structure comprising a gate electrode located over a channel region that separates a pair of source/drain regions within a semiconductor substrate, the gate electrode including a material composition portion having a vertically graded concentration of a volume change stress inducing ion implanted material and a first stress, said material composition portion is sandwiched between a lower buffer layer and an upper buffer layer, said lower buffer layer is in direct contact with a lower gate material layer and said upper buffer layer is in direct contact with an upper gate material layer, and the channel region having a second stress different than the first stress.

2. The semiconductor structure of claim 1 wherein the material composition portion comprises a metal nitride material composition.

3. The semiconductor structure of claim 1 wherein the material composition portion comprises a metal silicide material composition.

4. The semiconductor structure of claim 1 wherein the material composition portion comprises a silicon-germanium alloy material composition.

5. The semiconductor structure of claim 1 wherein the first stress is a tensile stress and the second stress is a compressive stress.

6. The semiconductor structure of claim 5 wherein the gate electrode is used within an nFET.

7. The semiconductor structure of claim 1 wherein the first stress is a compressive stress and the second stress is a tensile stress.

8. The semiconductor structure of claim 7 wherein the gate electrode is used within a pFET.

9. A semiconductor structure comprising a gate electrode located over channel region that separates a pair of source/drain regions within a semiconductor substrate, the gate electrode including a first metal nitride material composition portion interposed between a pair of second metal nitride material composition portions, the first metal nitride material composition portion having a vertically graded concentration of a volume change stress inducing ion implanted material and a first stress, the channel region having a second stress different than the first stress and said second metal nitride material portions are void of said vertically graded concentration of volume change stress inducing ion implanted material.

10. The semiconductor structure of claim 9 wherein the first metal nitride material composition portion comprises a metal nitride material selected from the group consisting of titanium, tantalum, tungsten, platinum, nickel and cobalt graded metal nitrides.

11. The semiconductor structure of claim 9 wherein the second metal nitride composition portions comprise a metal nitride material selected from the group consisting of titanium, tantalum, tungsten, platinum, nickel and cobalt non-graded metal nitrides.

12. The semiconductor structure of claim 9 wherein the first metal nitride material composition portion is substantially uniformly and symmetrically graded to the second metal nitride composition portions.

* * * * *